(12) United States Patent
Ottow et al.

(10) Patent No.: US 7,259,024 B2
(45) Date of Patent: Aug. 21, 2007

(54) METHOD OF TREATING A SUBSTRATE IN MANUFACTURING A MAGNETORESISTIVE MEMORY CELL

(75) Inventors: Stefan Ottow, Suresnes (FR); Kim Woosik, Boissettes (FR); Rainer Leuschner, Samoreau (FR)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 11/175,386

(22) Filed: Jul. 7, 2005

(65) Prior Publication Data

US 2007/0010031 A1    Jan. 11, 2007

(51) Int. Cl.
*H01L 21/00*        (2006.01)

(52) U.S. Cl. .................... 438/3; 438/906; 257/E21.665

(58) Field of Classification Search ............... 438/3, 438/906; 257/E21.665
See application file for complete search history.

(56) References Cited

U.S. PATENT DOCUMENTS

| 6,012,469 | A  | * | 1/2000 | Li et al. ..................... 134/1.3 |
| 6,774,418 | B2 | * | 8/2004 | Moore ........................ 257/288 |
| 2002/0067581 | A1 | * | 6/2002 | Hiramoto et al. ........... 360/322 |
| 2003/0082912 | A1 | * | 5/2003 | Kezuka et al. .............. 438/689 |
| 2003/0219912 | A1 | * | 11/2003 | Chen et al. ..................... 438/3 |
| 2006/0051967 | A1 | * | 3/2006 | Chang et al. ............... 438/710 |

* cited by examiner

*Primary Examiner*—Thao P. Le
(74) *Attorney, Agent, or Firm*—Edell, Shapiro & Finnan, LLC

(57) ABSTRACT

A method of treating a substrate in manufacturing a magnetoresistive memory cell includes performing a cleaning operation on the substrate using a mask layer as a protection layer for etching of a peripheral via. Further, an etch stop layer can used as a protection layer in a cleaning operation on the substrate.

5 Claims, 4 Drawing Sheets

METHOD OF TREATING A SUBSTRATE IN MANUFACTURING A MAGNETORESISTIVE MEMORY CELL

FIELD OF THE INVENTION

The present invention relates to the fabrication of non-volatile semiconductor memory chips and more particularly relates to a method of treating a substrate in manufacturing magnetoresistive random access memory cells (MRAM cells) for use in a semiconductor integrated circuit.

BACKGROUND

Particularly in view of volatility of random access memory chips as conventionally used in modern computer systems, in recent years, great effort has been made to bring non-volatile MRAM cells into practical use enabling the manufacture of instant-on systems that come to life as soon as the computer system is turned on. An MRAM cell basically includes a stacked structure of at least two magnetic layers that are separated by a non-magnetic tunneling barrier layer to form a magnetoresistive tunnel junction element or a conductive layer to form a magnetoresistive conductive junction element, both of which are commonly referred to as magnetoresistive junction elements. Contrary to conventional DRAMs, digital information is not maintained by power but by differently oriented magnetizations in the magnetic layers. More specifically, in an MRAM cell, magnetization of one magnetic layer is fixed or pinned, while magnetization of the other magnetic layer is free to be switched between two preferred directions along an easy axis of magnetization thereof, which typically is chosen to be in parallel alignment with the fixed magnetization. One bit of information thus is stored using the two different orientations of the freely switchable magnetization with respect to the fixed magnetization.

In the well-known standard CMOS process for manufacturing of MRAMs, upon a silicon or other suitable semiconductor substrate provided with active devices such as transistors and the like, metal lines and via contacts are used to provide interconnections for the integrated circuit and the magnetoresistive memory cell array. These interconnections typically are formed by depositing a dielectric layer above the semiconductor substrate, masking and etching thereof, followed by a metal deposition and planarization of the metal, all in a well-known manner. In accordance with the standard CMOS process nomenclature, metallic lines forming the first layer of interconnects are referred to as the first metallization layer (M1) and via contacts formed in a layer of dielectric material deposited above the first metallization layer M1 are referred to as the first via layer (V1). Likewise, metal lines formed in a layer of dielectric material deposited above the first via layer are referred to as the second metallization layer (M2), followed in sequence by a second via layer (V2) formed thereupon, a third metallization layer (M3) formed thereupon, and so on to provide as many via layers and metallization layers as are needed for the specific apparatus and application.

Reference is now made to FIG. 4 depicting a partial vertical sectional view of an intermediate product in a typical conventional process of manufacturing an MRAM cell. A substrate 1 is provided, which has above a surface of a semiconductor substrate provided with active structures, which is not shown in FIG. 4, a layer of dielectric material formed which is provided with metallic lines 2 for instance made of copper (Cu) to thereby create a metallization layer 3, which may for instance be identified as second metallization layer (M2). On the metallization layer 3, a dielectric layer 17 for instance made of silicon nitride (SiN) typically is formed which is provided with a via contact 4 for electrically connecting metal line 2 with a conductive plate 14 that is in electric contact with magnetoresistive junction element 5 formed above the dielectric layer 17. The magnetoresistive junction element 5 is embedded in a dielectric layer 6 for instance made of silicon oxide, onto which a SiN-layer 7 is formed to enhance deposition of an interlayer dielectric 8 for instance made of silicon oxide.

FIG. 4 shows a situation where a first opening 9 has already been etched which opening then is to be filled with conductive material for electrically contacting the magnetoresistive junction element 5 from above. Likewise, second opening 10 in the chip periphery has been etched, which is to be filled with conductive material to electrically connect metal line 2 with another metal line being part of another metallization layer (e.g., third metallization layer (M3)) formed thereupon (not shown in FIG. 4). Etching of the opening 10 typically is a two- or three-step process, i.e., a first etch step of etching opening 9 and simultaneously partly etching opening 10 down to the height of protrusion 11, and after creating an appropriate mask that is opened at partly etched opening 10, a second etch step in the peripheral region of the chip only to etch opening 10 down to the SiN-layer 17 and a third etch stop to etch opening 10 down to metal line 2, where the second and third etch steps relating to the second opening 10 may also be combined into a single etch step.

In such conventional manufacturing of MRAM cells as explained referring to FIG. 4, a problem arises that, as the magnetoresistive junction element 5 as shown in FIG. 4 is formed from a corresponding stack of layers deposited on the SiN-layer 17 beforehand using conventional etch techniques, resputtering effects are very likely to occur that may lead to the undesired deposition of polymeric/metallic compositions on side wall regions 12 of the formed magnetoresistive junction element 5. Otherwise, etching of the second opening 10 down to metal line 2 due to over-etching thereof may also create polymeric/metallic compositions that are particularly deposited in a bottom region 13 of the opened metal line 2 and on a top surface of the magnetoresistive junction element 5.

Such polymeric/metallic residuals, however, may be embedded in later process steps and can cause severe problems as to an outgassing thereof or modification or creation of interface layers. Accordingly, in order to avoid such problems, removal of the polymeric/metallic residuals has been envisaged using a dedicated cleaning step as usual after having created openings 9, 10 for instance using water diluted hydrofluoric acid (DHF) or buffered hydrofluoric acid. However, as has been experienced, such conventional cleaning step cannot be done, since polymeric/metallic residuals on the side walls of the magnetoresistive junction element 5 are etched-off to thereby create small trenches at the side walls of the magnetoresistive junction element 5 which are filled with conductive material in filling the opening 9 with conductive material, so that conductive paths (shorts) in the magnetoresistive junction element 5 bridging the magnetic layers can be formed. Otherwise, removal of the polymeric/metallic residuals on a bottom area of the second opening 10 may risk damage or at least degradation of the electrical properties of the opened metal line.

SUMMARY

In light of the above, the invention includes an improved method of cleaning a substrate in manufacturing MRAM cells that allows removal of the polymeric/metallic residuals created during structuring of magnetoresistive junction elements or forming of vias without risking creating shorts of the magnetoresistive junction elements and without risking damage or degradation electrical properties of opened metal lines.

According to a first aspect of the invention, a method of treating a substrate in manufacturing a magnetoresistive memory cell is disclosed, which comprises the following steps:

providing a substrate comprising: a semiconductor substrate (which is different from the above "substrate," the latter one comprising plural layers/structures on a surface of the semiconductor substrate) typically being provided with active structures such as transistors and the like; at least one metallization layer comprising a plurality of metallic regions such as metallic lines being formed above a surface of the semiconductor substrate; a first non-conductive layer comprising a non-conductive material formed above the metallization layer for instance made of silicon nitride (SiN) that is provided with an electric interconnection such as a via connection electrically connecting a first one of the metallic regions with a magnetoresistive junction element formed above the first non-conductive layer; a second non-conductive layer comprising a non-conductive material such as silicon oxide being formed above the first non-conductive layer at least over the magnetoresistive junction element and at least over a second one of the metallic regions of the metallization layer;

etching a first opening in the second non-conductive layer wherein at least a portion, in particular a complete upper surface of the magnetoresistive junction element, is exposed;

partially etching a second opening in the second non-conductive layer at least over the second metallic region, where etching of the first opening and partially etching the second opening can be effected in the same etch step;

depositing a mask layer, which may be a photosensitive layer, in the second non-conductive layer and structuring thereof to create a mask having a mask opening at least over the partially etched second opening;

performing a cleaning operation of the substrate using the mask as protecting layer, where cleaning for instance is effected using hydrofluoric acid, such as BHF or DHF;

fully etching the second opening, wherein at least a portion of the second metallic region is exposed; and removing the mask.

Since cleaning of the substrate is performed using the mask as a protection layer, the magnetoresistive junction element is protected by the mask, so that advantageously no polymeric/metallic residuals can be deposited on a top surface of the magnetoresistive junction element during fully etching the second opening. Otherwise, polymeric/metallic residuals remain on the side walls of the magnetoresistive junction element, so that shorts due to voids filled with conductive material can be avoided.

In the above method of treating a substrate, before performing the cleaning operation of the substrate using the mask as protecting layer, another etch step of partially etching the second opening until a portion of the first non-conductive layer is exposed, can be performed.

According to a second aspect of the invention, a method of treating a substrate in manufacturing a magnetoresistive memory cell is disclosed, which comprises the following steps:

providing a substrate comprising: a semiconductor substrate typically being provided with active structures such as transistors and the like; at least one metallization layer comprising a plurality of metallic regions such as metallic lines being formed above a surface of the semiconductor substrate; a first non-conductive layer comprising a non-conductive material formed above the metallization layer for instance made of silicon nitride (SiN) that is provided with an electric interconnection such as a via connection electrically connecting a first one of the metallic regions with a magnetoresistive junction element formed above the first non-conductive layer; a second non-conductive layer comprising a non-conductive material such as silicon oxide formed above the first non-conductive layer at least over the magnetoresistive junction element and at least over a second one of the metallic regions of the metallization layer; a third non-conductive layer comprising a non-conductive material having etch-selectivity as to the non-conductive material of the second non-conductive layer formed at least in between the magnetoresistive junction element and the second non-conductive layer; accordingly, the third non-conductive layer can be seen as etch stop layer in etching the second non-conductive layer;

partially etching a first opening in the second non-conductive layer wherein a portion of the third non-conductive layer, in particular an upper surface thereof, at least over the magnetoresistive junction element is exposed;

partially etching a second opening in the second non-conductive layer at least over the second metallic region, wherein partially etching of the first opening in the second non-conductive layer and partially etching of the second opening in the second non-conductive layer can be done in the same etch step;

performing a cleaning operation of the substrate using the third non-conductive layer as a protection layer, for instance using hydrofluoric acid, such as BHF or DHF;

fully etching the first opening wherein at least a portion of an upper surface of the magnetoresistive junction element is exposed; and fully etching the second opening, wherein at least a portion of the second metallic region is exposed, wherein fully etching of the first opening in the second non-conductive layer and fully etching of the second opening in the second non-conductive layer can be done in the same etch step, advantageously using a same etch chemistry.

Accordingly, since cleaning of the substrate is performed using the third non-conductive layer as a protection layer, the magnetoresistive junction element is protected by the third non-conductive layer, so that advantageously no polymeric/metallic residuals can be deposited on a top surface of the magnetoresistive junction element during etching the first and second openings. Otherwise, polymeric/metallic residuals remain on the side walls of the magnetoresistive junction element, so that shorts due to voids filled with conductive material can be avoided.

According to a third aspect of the invention, a method of treating a substrate in manufacturing a magnetoresistive memory cell is disclosed, which comprises the following steps:

providing a substrate comprising: a semiconductor substrate typically being provided with active structures such as transistors and the like; at least one metallization layer comprising a plurality of metallic regions such as metallic lines formed above a surface of the semiconductor substrate; a first non-conductive layer comprising a non-conductive material formed above the metallization layer for instance made of silicon nitride (SiN) that is provided with an electric interconnection such as a via connection electrically connecting a first one of the metallic regions with a magnetoresistive junction element formed above the first non-conductive layer; a second non-conductive layer comprising a non-conductive material such as silicon oxide formed above the first non-conductive layer at least over the magnetoresistive junction element and at least over a second one of the metallic regions of the metallization layer; a third non-conductive layer comprising a non-conductive material having etch-selectivity as to the non-conductive material of the second non-conductive layer and formed at least in between the magnetoresistive junction element and the second non-conductive layer; accordingly, the third non-conductive layer can operate as etch stop layer in etching the second non-conductive layer;

partially etching a first opening in the second non-conductive layer wherein a portion of the third non-conductive layer, in particular an upper surface thereof, at least over the magnetoresistive junction element is exposed;

etching a second opening in the second non-conductive layer, wherein at least a portion of the second metallic region is exposed, wherein partially etching of the first opening in the second non-conductive layer and etching of the second opening in the second non-conductive layer can be done in the same etch step;

performing a cleaning operation of the substrate using the third non-conductive layer as a protection layer, for instance using hydrofluoric acid, such as BHF or DHF; and fully etching the first opening wherein at least a portion of an upper surface of the magnetoresistive junction element is exposed.

Since cleaning of the substrate is performed using the third non-conductive layer as a protection layer, the magnetoresistive junction element is protected by the third non-conductive layer, so that advantageously no polymeric/metallic residuals can be deposited on a top surface of the magnetoresistive junction element during etching the first and second openings. Otherwise, polymeric/metallic residuals remain on the side walls of the magnetoresistive junction element, so that shorts due to voids filled with conductive material can be avoided.

Other and further objects, features and advantages of the invention will appear more fully from the following description.

BRIEF DESCRIPTION OF THE DRAWINGS

The accompanying drawings, which are incorporated in and constitute a part of the specification, illustrate embodiments of the invention, and together with the general description given above and the detailed description given below, serve to explain the principles of the invention.

DETAILED DESCRIPTION

Embodiments of the present invention will be described in detail below with reference to the accompanying drawings, where like designations denote like or similar elements.

Figure 1A:
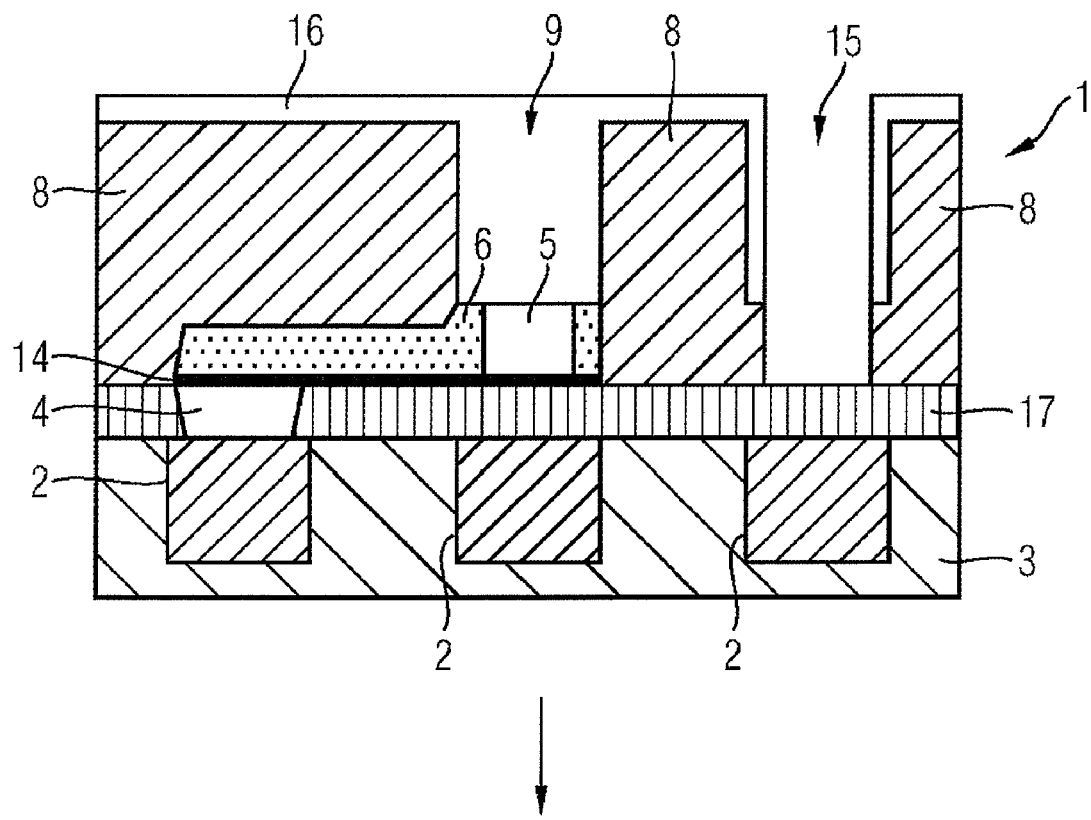
FIGS. 1A and 1B depict schematically vertical sectional views of intermediate products in treating substrates in manufacturing MRAM cells according to an embodiment of the first aspect of the invention.
Figure 1B:
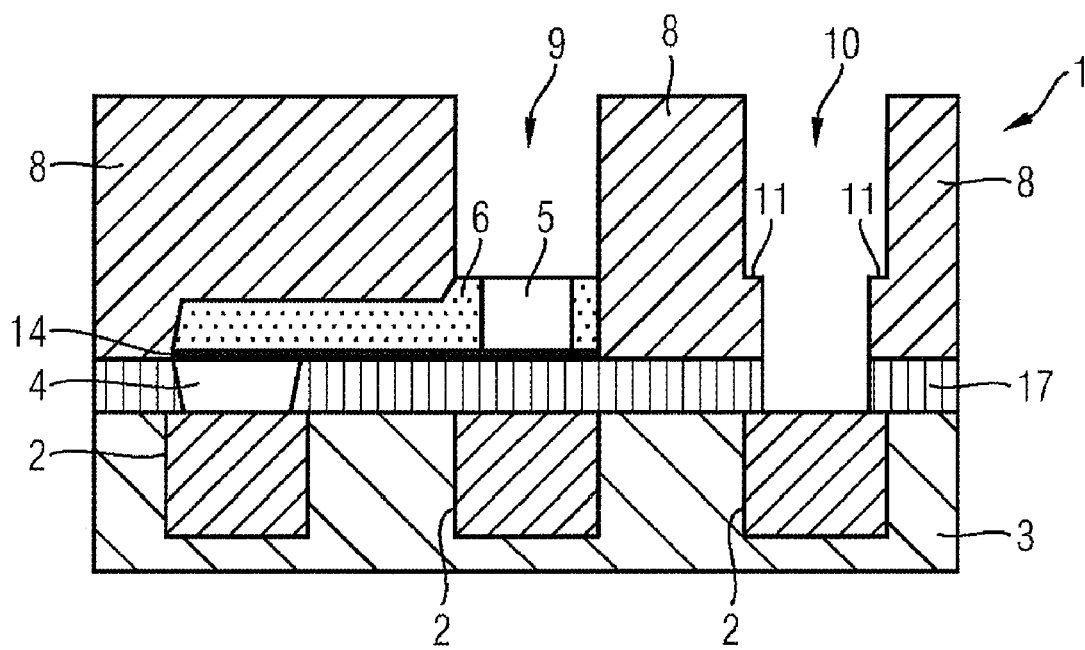

First, reference is made to FIGS. 1A and 1B which depict schematically vertical sectional views of intermediate products to illustrate a method of treating substrates in manufacturing MRAM cells according to an embodiment of the first aspect of the invention. FIG. 1A schematically depicts a partial vertical sectional view of an intermediate product in a process of manufacturing of MRAM cells, where a substrate commonly referred to with reference numeral 1 is provided, which comprises a semiconductor substrate provided with active structures (not shown in FIG. 1A) on a surface of which a layer of dielectric material is formed which is provided with metallic lines 2 for instance made of copper (Cu) to thereby create metallization layer 3, which in the embodiment of FIG. 1A is the second metallization layer (M2) but might also be identified as another metallization layer such as the third or fourth metallization layers.

On the metallization layer 3, a dielectric layer 17 made of silicon nitride (SiN) is formed which is provided with a via contact 4 for electrically connecting metal line 2 with a conductive plate 14 that is in electrical contact with magnetoresistive junction element 5 formed above the dielectric layer 3. The magnetoresistive junction element 5 can be identified as magnetoresistive tunnel junction element or can also be identified as magnetoresistive conductive junction element. The magnetoresistive junction element 5 is embedded in a dielectric layer 6 made of silicon oxide. Thereupon, an interlayer dielectric 8 made of silicon oxide is deposited. In FIG. 1A, a situation is shown, where a first opening 9 has already been etched to uncover an upper surface of the magnetoresistive junction element 5, which then is to be filled with conductive material for electrically contacting the magnetoresistive junction element 5 from above. Also, partly etched second opening 15 is shown, which uncovers an upper surface of the SiN-layer 17 over a peripheral metallic line 2 which is to be connected with another metallic line of the third metallization layer (M3) arranged above M2. Opening of the first and second opening can be done by conventional masking and etching operations well-known to those skilled in the art.

Etching of the partly etched second opening 15 is done in a two-step etch process. A first etch step of commonly etching the first opening 9 until the upper surface of the magnetoresistive junction element 5 is reached and etching the partly etched second opening 15 until a height of protrusion 11 is reached. After depositing a photosensitive layer and preparing an etch mask 16 having an opening over the partly etched second opening 15, a second etch step is performed to deepen the partly etched second opening 15 to uncover a portion of the upper surface of the SiN-layer 17. Next, a cleaning step using hydrofluoric acid such as BHF or DHF is performed to remove polymeric/metallic residuals on the substrate's 1 upper area wherein the etch mask 16 is used as a protection layer. Accordingly, cleaning has to be performed appropriately to not compromise integrity of the etch mask 16. Now, reference is made to FIG. 1B. Having cleaned the substrate 1, the SiN-layer 17 is etched to create fully etched second opening 10 that uncovers an upper surface of the peripheral metallic line 2 which then is filled with conductive material for electric connection to M3. Afterwards, the etch mask 16 is removed which can be done by a conventional stripping technique.

Figure 2A:
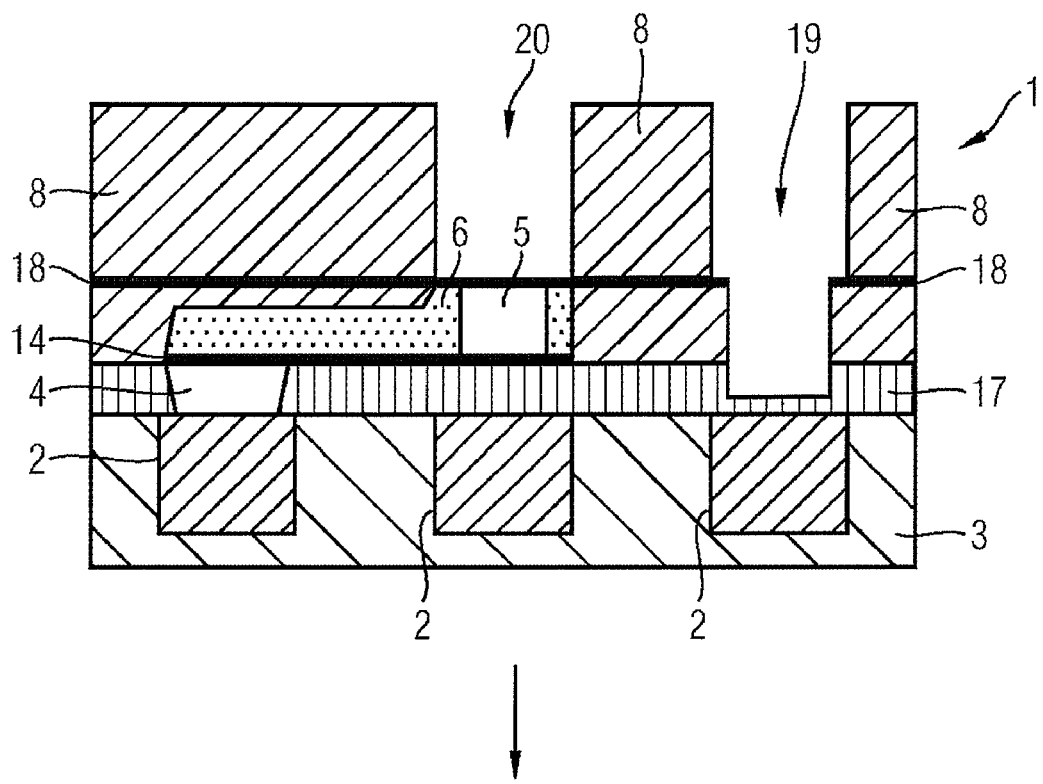
FIGS. 2A and 2B depict schematically vertical sectional views of intermediate products in treating substrates in manufacturing MRAM cells according to an embodiment of the second aspect of the invention.
Figure 2B:
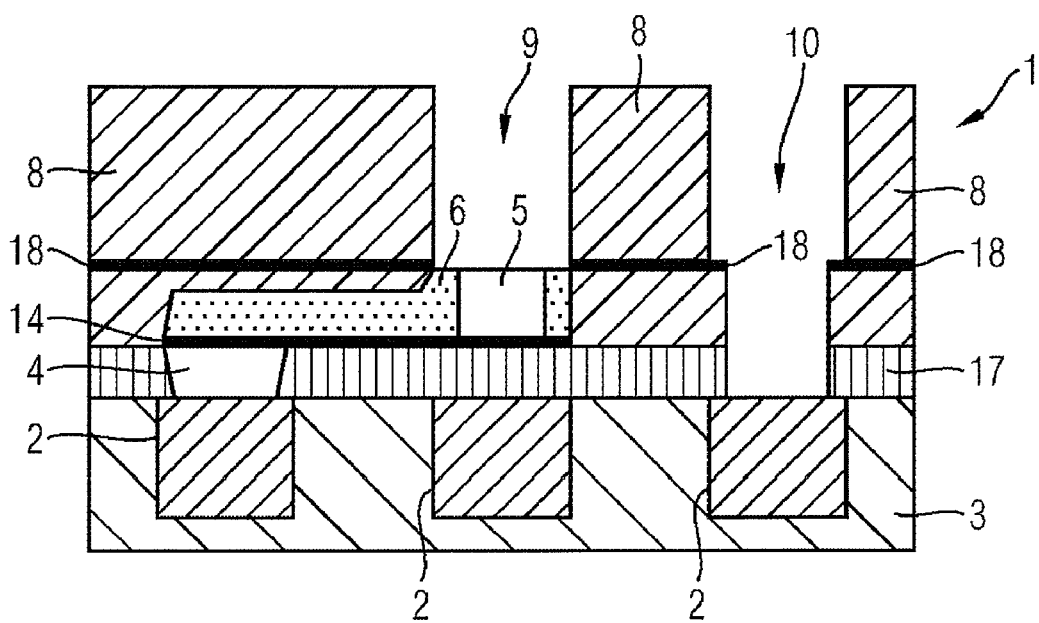

Now, reference is made to FIGS. 2A and 2B which depict schematically vertical sectional views of intermediate products to illustrate a method of treating substrates in manufacturing MRAM cells according to an embodiment of the second aspect of the invention. FIG. 2A schematically depicts a partial vertical sectional view of an intermediate product in a process of manufacturing of MRAM cells, where a substrate commonly referred to with reference numeral 1 is provided, which comprises a semiconductor substrate provided with active structures (not shown in FIG. 2A) on a surface of which a layer of dielectric material is formed which is provided with metallic lines 2 for instance made of copper (Cu) to thereby create metallization layer 3, which in the embodiment of FIG. 2A is the second metallization layer (M2) but can also be identified as another metallization layer such as the third or fourth metallization layers. On the metallization layer 3, a dielectric layer 17 made of silicon nitride (SiN) is formed which is provided with a via contact 4 for electrically connecting metal line 2 with a conductive plate 14 that is in electrical contact with magnetoresistive junction element 5 formed above the dielectric layer 3. The magnetoresistive junction element 5 can be identified as magnetoresistive tunnel junction element or can also be identified as magnetoresistive conductive junction element. The magnetoresistive junction element 5 is embedded in a dielectric layer 6 made of silicon oxide. Thereupon, an interlayer dielectric 8 made of silicon oxide is deposited. In FIG. 2A, etch stop layer 18 comprising a non-conductive material such as silicon carbide (SiC) or silicon nitride (SiN) and having etch-selectivity as to the interlayer dielectric 8 to be able to function as etch stop layer is provided between the magnetoresistive junction element 5 and an upper part of the interlayer dielectric 8. Etch stop layer 18 can be easily manufactured by depositing interlayer dielectric layer 8 material onto the substrate's 1 surface, planarization thereof until the height of the magnetoresistive junction element 5, depositing the etch stop layer 18, followed by further depositing of interlayer dielectric 8 material on the surface of the etch stop layer 18. In FIG. 2A, a situation is shown, where a partly etched first opening 20 has been etched to uncover an upper surface of the etch stop layer 18. Further, partly etched second opening 19 has been etched, which uncovers an inner portion of the SiN-layer 17 over a peripheral metallic line 2. Now, a cleaning step using hydrofluoric acid such as BHF or DHF is performed to remove polymeric/metallic residuals on the substrate's 1 upper area wherein the etch stop layer 18 is used as a protection layer. Accordingly, cleaning has to be performed appropriately not to compromise integrity of the etch stop layer 18. Now, reference is made to FIG. 2B. Having cleaned the substrate 1, the etch stop layer 18 is etched to create first opening 9 to uncover an upper surface of the magnetoresistive junction element and remaining SiN-layer 17 in the partly etched second opening 19 is etched to create the second opening 10 to uncover metallic line 2, which etchings preferably are done in same etch step using the same etch chemistry.

Figure 3A:
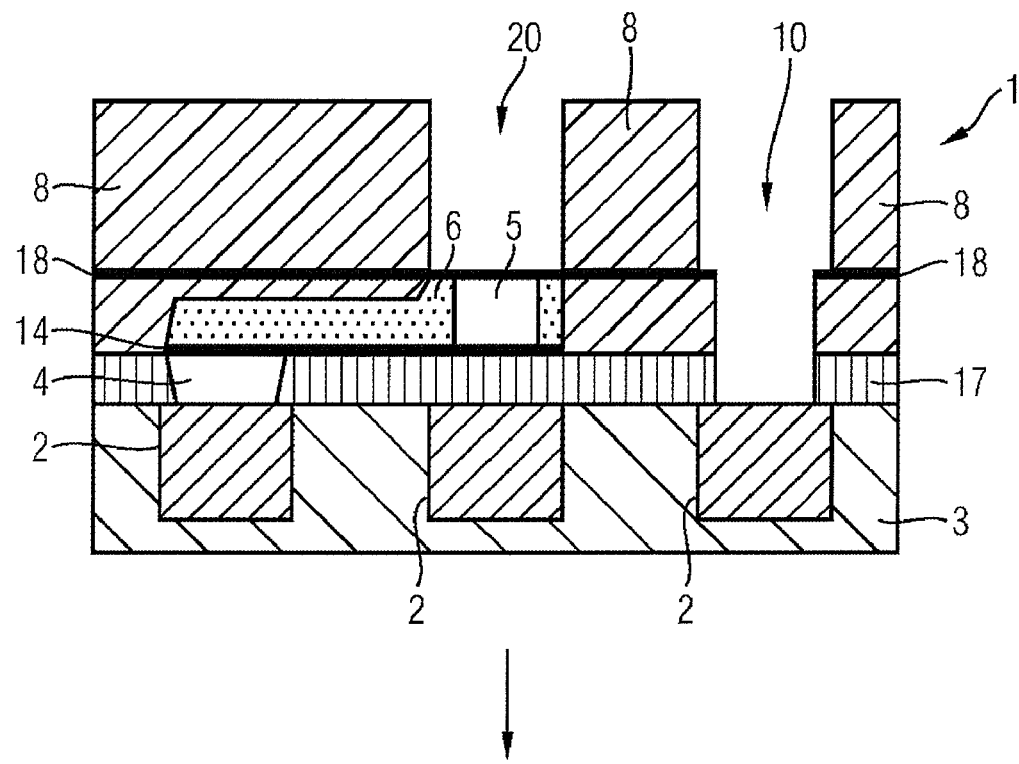
FIGS. 3A and 3B depict schematically vertical sectional views of intermediate products in treating substrates in manufacturing MRAM cells according to an embodiment of the third aspect of the invention.
Figure 3B:
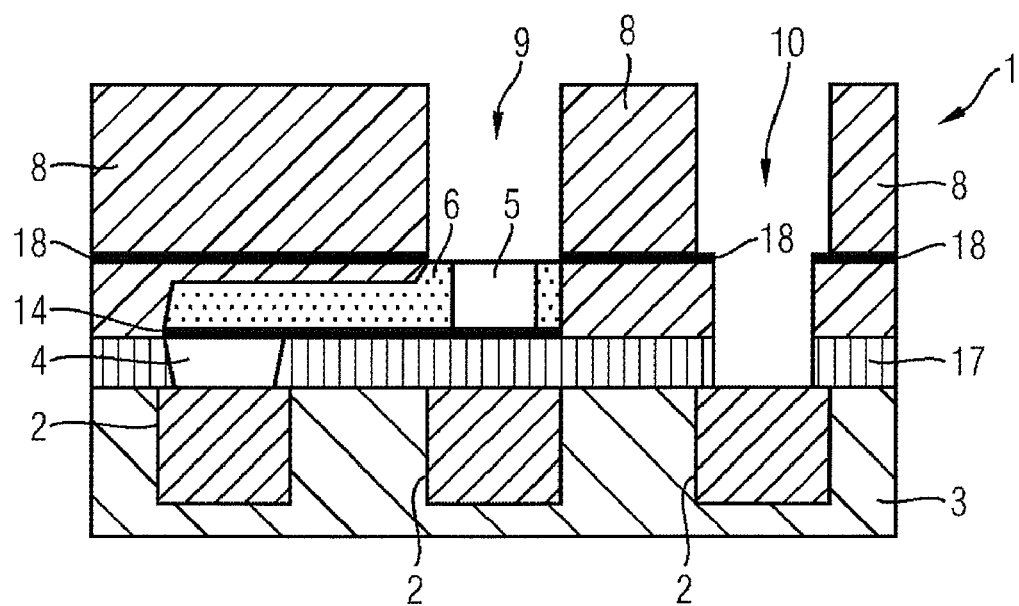
Figure 4:
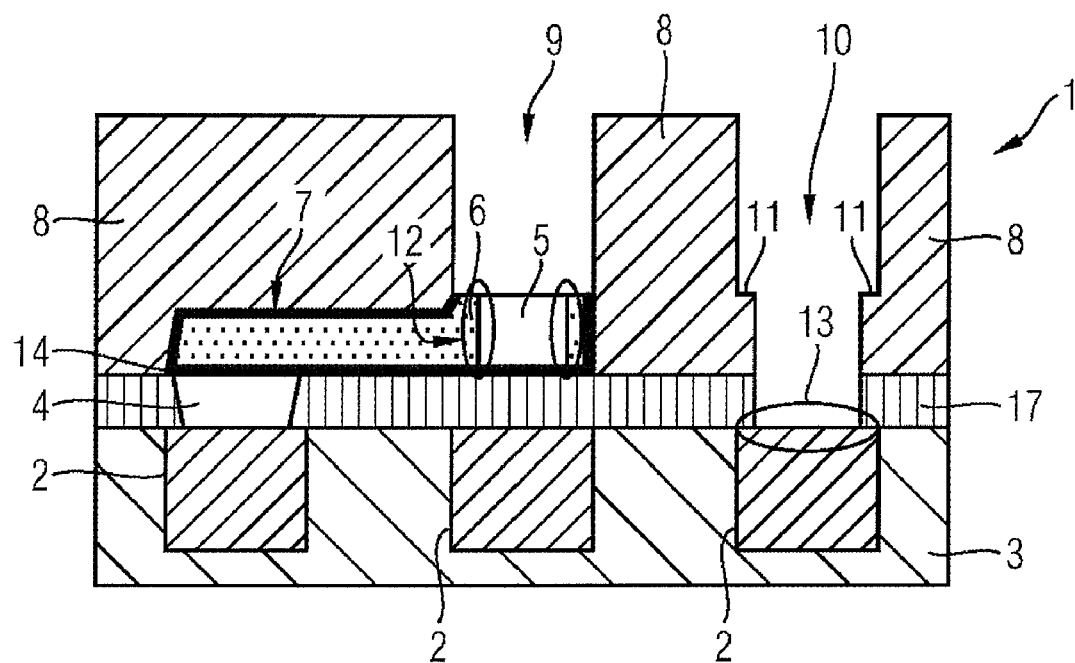
FIG. 4 depicts schematically a vertical sectional view of an intermediate products in a conventional process sequence of manufacturing MRAM cells.

Now, reference is made to FIGS. 3A and 3B which depict schematically vertical sectional views of intermediate products to illustrate a method of treating substrates in manufacturing MRAM cells according to an embodiment of the third aspect of the invention, which is a variant of the second aspect of the invention. In order to avoid unnecessary repetitions merely the differences as to the embodiment of FIGS. 2A and 2B are explained, otherwise reference is made thereto. In FIG. 3A, a situation is shown, where a partly etched first opening 20 has been etched to uncover an upper surface of the etch stop layer 18. Further, second opening 10 has already been fully etched, which uncovers a peripheral metallic line 2. Now, a cleaning step using hydrofluoric acid such as BHF or DHF is performed to remove polymeric/metallic residuals on the substrate's 1 upper wherein the etch stop layer 18 is used as a protection layer. Reference is made to FIG. 3B. Having cleaned the substrate 1, the etch stop layer 18 is etched to create first opening 9 to uncover an upper surface of the magnetoresistive junction element 5.

While in above exemplary embodiments of the methods according to the invention, processing with respect to only one peripheral via contact and MRAM cell has been demonstrated, those skilled in the art will appreciate that such methods can also be applied to a plurality of such via contacts and MRAM cells, respectively.

Obviously many modifications and variations of the present invention are possible in light of the above description. It is therefore to be understood, that within the scope of appended claims, the invention may be practiced otherwise than as specifically devised.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SIGNS

1 Substrate
2 Metallic line
3 Metallization layer
4 Via contact
5 Magnetoresistive junction element
6 Dielectric layer
7 SiN-layer
8 Interlayer dielectric
9 First opening
10 Second opening
11 Protrusion
12 Side wall region
13 Bottom region
14 Conductive plate
15 Partly etched second opening
16 Photoresist mask
17 SiN-layer
18 Etch stop layer
19 Partly etched second opening
20 Partly etched first opening

What is claimed is:

1. A method of treating a substrate in manufacturing a magnetoresistive memory cell, the method comprising:
providing a substrate comprising: a semiconductor substrate; at least one metallization layer having a plurality of metallic regions formed above a surface of the semiconductor substrate; a first non-conductive layer comprising a non-conductive material formed above the metallization layer and provided with an electrical interconnection electrically connecting a first one of the metallic regions with a magnetoresistive junction element formed above the first non-conductive layer; and a second non-conductive layer comprising a non-conductive material formed above the first non-conductive layer at least over the magnetoresistive junction element and a second one of the metallic regions of the metallization layer;

etching a first opening in the second non-conductive layer, wherein at least a portion of an upper surface of the magnetoresistive junction element is exposed;

partially etching a second opening in the second non-conductive layer at least over the second metallic region;

depositing a mask layer on the second non-conductive layer and structuring thereof to create a mask having a mask opening at least over the partially etched second opening;

performing a cleaning operation on the substrate using the mask as protecting layer;

fully etching the second opening, wherein at least a portion of the second metallic region is exposed; and removing the mask.

2. The method of claim 1, further comprising partially etching the second opening, wherein a portion of the first non-conductive layer is exposed.

3. The method of claim 1, wherein the cleaning operation is performed using hydrofluoric acid.

4. The method of claim 1, wherein the mask layer is a photosensitive layer.

5. The method of claim 1, wherein etching the first opening and partially etching the second opening are performed in the same etch step.

* * * * *

UNITED STATES PATENT AND TRADEMARK OFFICE
CERTIFICATE OF CORRECTION

PATENT NO. : 7,259,024 B2  Page 1 of 1
APPLICATION NO. : 11/175386
DATED : August 21, 2007
INVENTOR(S) : Ottow et al.

It is certified that error appears in the above-identified patent and that said Letters Patent is hereby corrected as shown below:

Title page should read

(73) Assignees:

Infineon Technologies AG, Neubiberg (DE)
Altis Semiconductor, Corbeil Essonnes (FR)

Signed and Sealed this

Seventh Day of October, 2008

JON W. DUDAS
*Director of the United States Patent and Trademark Office*

UNITED STATES PATENT AND TRADEMARK OFFICE
CERTIFICATE OF CORRECTION

PATENT NO.      : 7,259,024 B2
APPLICATION NO. : 11/175386
DATED           : August 21, 2007
INVENTOR(S)     : Ottow et al.

It is certified that error appears in the above-identified patent and that said Letters Patent is hereby corrected as shown below:

Title page should read

(73) Assignees:

Infineon Technologies AG, Neubiberg (DE)
Altis Semiconductor SNC, Corbeil Essonnes (FR)

This certificate supersedes the Certificate of Correction issued October 7, 2008.

Signed and Sealed this

Tenth Day of February, 2009

JOHN DOLL
*Acting Director of the United States Patent and Trademark Office*